US011686758B2

(12) United States Patent
Varga et al.

(10) Patent No.: US 11,686,758 B2
(45) Date of Patent: Jun. 27, 2023

(54) ARC FAULT DETECTION DEVICE WITH WIDEBAND SENSOR

(71) Applicant: ABB Schweiz AG, Baden (CH)

(72) Inventors: Matija Varga, Zürich (CH); Yannick Maret, Dättwil (CH); Agostino Butti, Milan (IT); Antonio Currà, Abbiategrasso (IT); Vittorio Cozzi, Arluno (IT); Luca Ghezzi, Gallarate (IT)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 17/484,055

(22) Filed: Sep. 24, 2021

(65) Prior Publication Data

US 2022/0091172 A1 Mar. 24, 2022

(30) Foreign Application Priority Data

Sep. 24, 2020 (EP) .................................... 20198185

(51) Int. Cl.
*G01R 31/08* (2020.01)
*G01R 31/12* (2020.01)
(Continued)

(52) U.S. Cl.
CPC ........... *G01R 31/085* (2013.01); *G01R 31/08* (2013.01); *G01R 31/1272* (2013.01); *H02H 1/0015* (2013.01); *H02H 3/16* (2013.01)

(58) Field of Classification Search
CPC .......... H02H 1/00; H02H 3/46; H02H 1/0015; H02H 3/16; H02H 3/105; H02H 3/08; G01R 31/08; G01R 31/12; G01R 31/085
(Continued)

(56) References Cited

U.S. PATENT DOCUMENTS 5,805,397 A 9/1998 MacKenzie
5,889,643 A 3/1999 Elms
(Continued)

FOREIGN PATENT DOCUMENTS

CA 2307537 A1 11/2000
CN 101162851 A 4/2008
(Continued)

*Primary Examiner* — Danny Nguyen
(74) *Attorney, Agent, or Firm* — Leydig, Voit & Mayer, Ltd.

(57) ABSTRACT

An arc fault detection device for detecting an arc fault in an electric line includes a first terminal and a second terminal for connecting the arc fault detection device to a conductor of the electric line. A sensor is adapted for generating a sensor signal from a current through the electric line; and a controller is adapted for detecting the arc fault from the sensor signal. The sensor includes an inductor connected to the first terminal and the second terminal and a capacitor connected in parallel with the inductor. The inductor and the capacitor form a resonant circuit with a resonance frequency, the resonance frequency determining an impedance behavior of the resonant circuit; wherein the inductor and the capacitor are chosen such that the impedance behavior of the resonant circuit corresponds to a desired impedance behavior over a relevant frequency range of the current through the electric line.

19 Claims, 5 Drawing Sheets

100, 110, 106, 104, 116, 112, 102, 122, 121, 120, 130, 124,134, 128, 136, 132, 138, 126, 140, 118, 114, 108

(51) Int. Cl.
*H02H 1/00* (2006.01)
*H02H 3/16* (2006.01)

(58) Field of Classification Search
USPC ........................................................ 361/42–50
See application file for complete search history.

(56) References Cited

U.S. PATENT DOCUMENTS 6,031,699 A 2/2000 Dollar, II et al.
6,373,257 B1 4/2002 Macbeth et al.
6,452,767 B1 9/2002 Brooks
6,590,754 B1 7/2003 Macbeth
6,628,487 B1 9/2003 Macbeth
6,751,528 B1 6/2004 Dougherty
6,987,389 B1 1/2006 Macbeth et al.
8,599,523 B1 12/2013 Ostrovsky et al.
2001/0033469 A1* 10/2001 Macbeth .............. H02H 1/0015 361/42
2007/0165349 A1 7/2007 Parker
2007/0188955 A1 8/2007 Elms
2008/0204950 A1 8/2008 Zhou et al.
2010/0157486 A1 6/2010 Parker et al.
2010/0321836 A1 12/2010 Dvorak et al.
2011/0002446 A1 1/2011 Beland
2011/0141644 A1 6/2011 Hastings et al.
2011/0181296 A1 7/2011 Kolker et al.
2012/0119751 A1 5/2012 Scott et al.
2013/0169290 A1 7/2013 Shea
2014/0062500 A1* 3/2014 Behrends ................ H02S 50/10 324/537
2014/0104731 A1 4/2014 Kolker et al.
2014/0218044 A1 8/2014 Ostrovsky et al.
2015/0365003 A1 12/2015 Sadwick
2016/0013623 A1 1/2016 Zheng et al.
2016/0146857 A1* 5/2016 Behrends ........... G01R 19/0015 324/127
2018/0180671 A1* 6/2018 Kalgren ............. G01R 31/2837
2019/0181628 A1* 6/2019 Ward ................... H02H 1/0015
2019/0207653 A1* 7/2019 Bieber ..................... H04B 1/04
2021/0305801 A1* 9/2021 Kinsel .................... H01C 7/108

FOREIGN PATENT DOCUMENTS

CN 110632472 A 12/2019
DE 10203163 A1 8/2003
EP 0820651 B1 3/2009
WO WO 99/53331 A1 10/1999
WO WO 01/02872 A1 1/2001
WO WO 2018/177028 A1 10/2018

* cited by examiner 132
130
140
304,uLF
304,uHF
306
308
300
202
200
206
302
310
136
126
212
214
100
128
124,134
138

ARC FAULT DETECTION DEVICE WITH WIDEBAND SENSOR

CROSS-REFERENCE TO RELATED APPLICATIONS

This patent application claims the benefit of European Patent Application No. 20198185.9, filed Sep. 24, 2020, which is fully incorporated herein by reference.

FIELD OF THE INVENTION

The invention relates to the field of arc fault detection. In particular, the invention relates to an arc fault detection device and to a method, a computer program and a computer-readable medium for operating an arc fault detection device.

BACKGROUND OF THE INVENTION

The detection of arc faults in electric lines is crucial for preventing fires caused by a faulty electrical installation. Among other typical features such as characteristic variations of a current amplitude, an arc fault generates a characteristic signal whose power spectral density is inversely proportional to its frequency.

Typically, one or more dedicated sensing elements such as current transformers or shunts are used to convert a current through an electric line to a voltage signal that contains such an arc fault signature. Current transformers often constitute a trade-off between size, cost and performance. Sensing currents at low frequencies usually requires relatively large and costly transformers. On the other hand, smaller and more cost-effective transformers may have higher losses, which may decrease their sensitivity, i.e. performance.

For example, an arc fault detection device may comprise two current transformers: one for sensing currents around a powerline frequency, e.g. 50 or 60 Hz, and its harmonics, and another one for sensing currents at relatively high frequencies, e.g. in the Megahertz range (1 MHz or more).

DESCRIPTION OF THE INVENTION

It is an objective of the invention to reduce the size and the manufacturing costs of an arc fault detection device. In particular, it is an objective of the invention to provide an arc fault detection device with a single and relatively small sensing element for providing a sufficiently strong sensor signal over a sufficiently wide frequency range.

This objective is achieved by the subject-matter of the independent claims. Further exemplary embodiments are evident from the dependent claims and the following description.

A first aspect of the invention relates to an arc fault detection device for detecting an arc fault in an electric line. The arc fault detection device comprises a first terminal and a second terminal for connecting the arc fault detection device to a conductor of the electric line, a sensor adapted for generating a sensor signal from a current through the electric line and a controller adapted for detecting the arc fault from the sensor signal. A sensor signal may be a voltage signal and/or a current signal. The sensor comprises an inductor connected to the first terminal and the second terminal and a capacitor connected in parallel with the inductor. The inductor and the capacitor form a resonant circuit with a resonance frequency, the resonance frequency determining an impedance behavior of the resonant circuit.

The inductor and the capacitor are chosen such that the impedance behavior of the resonant circuit corresponds to a desired impedance behavior over a relevant frequency range of the current through the electric line. More precisely, the inductance of the inductor and/or the capacitance of the capacitor may be chosen such that the resonant circuit has a desired resonance frequency that causes the inductor to have the desired impedance behavior.

The electric line may be adapted for electrically connecting an electric power source, e.g. a power grid or a battery, to a load. In operation, the electric power source and the load may be interconnected via the arc fault detection device. The electric line may comprise one or more conductors. For example, the electric line may comprise one or more phase conductors and/or a neutral conductor.

The first terminal of the arc fault detection device may be connectable to an upstream portion of the conductor which is connected to the electric power source. The second terminal of the arc fault detection device may be connectable to a downstream portion of the conductor which is connected to the load.

Additionally, the arc fault detection device may comprise at least one further pair of terminals for at least one further conductor of the electric line. For example, the arc fault detection device may comprise a first pair of terminals for a phase conductor of the electric line and a second pair of terminals for a neutral conductor of the electric line. It is also possible that the arc fault detection comprises more than two pairs of terminals.

The controller may be adapted for controlling the operation of the arc fault detection device. In particular, the controller may further be adapted for generating a trip signal for interrupting the electric line when an arc fault has been detected. The trip signal may be used to open a circuit breaker arranged in one of the conductors of the electric line.

The controller may be implemented as hardware and/or software. The controller may comprise a processor and a memory for storing a computer program executable by the processor. The computer program may comprise instructions which cause the processor to perform an algorithm for detecting typical features of an arc fault in the sensor signal. An arc fault may be detected in a single conductor, between (parallel) conductors or between a conductor and ground.

In order to detect such features, the controller may be adapted for filtering the sensor signal and for analyzing different frequency bands of the sensor signal. For example, the difference of a power spectral density between these frequency bands may be more than four orders of magnitude. An arc fault between parallel conductors, i.e. a parallel arc, may, for example, be detected predominantly based on specific (harmonic) distortions and/or specific amplitude fluctuations of the current through the electric line at low frequencies, e.g. around 50 Hz. An arc fault in a single conductor, i.e. a series arc, may, for example, be detected predominantly based on specific broadband noise and/or specific high-frequency noise correlated with zero-crossings of the current through the electric line. As a result, the algorithm may output a binary response such as "1" for "arc fault" and "0" for "no arc fault".

The sensor may be adapted for measuring a voltage across the inductor, e.g. between a load side and a line side of the inductor.

It may be that at least one of the sensor and the controller is fed by the electric line through a power supply of the arc fault detection device.

The resonant circuit may be seen as an impedance matching stage of the sensor. The resonance frequency of the resonant circuit may be in the Megahertz range. For example, the resonance frequency may be at least 1 MHz. The resonance frequency determines a position of a maximum of the resonant circuit's impedance within the relevant frequency range of the current through the electric line. For example, the relevant frequency range may have a lower limit of 0 and an upper limit of 20 MHz or even 1 GHz.

The desired impedance behavior of the resonant circuit may, for example, resemble to a curve with a rising portion followed by a falling portion or a curve with a rising portion followed by an approximately constant portion.

The resonant circuit may have a low impedance at frequencies where the energy of a characteristic signal, e.g. of the current through the electric line, is high and vice versa. With the resonant circuit, the impedance behavior can be adjusted in such a way that the measured voltage across the inductor can be used to capture the entire dynamic of an arc fault.

By using a single inductor instead of two current transformers as a sensor, the arc fault detection device can be further miniaturized and the manufacturing costs of the arc fault detection device can be significantly reduced.

Tests have shown that a sufficient dynamic range to measure a signal of interest over a frequency range between 50 Hz and 20 MHz can be achieved using such a sensor with only one inductor.

At low frequencies an inductor can be regarded as a resistive element, whereas at higher frequency its inductive behavior becomes more pronounced. With the resonant circuit, the impedance of the inductor, i.e. the sensitivity or performance of the sensor, can be precisely adapted to a signal strength at the frequencies of interest. In this way, a relatively high sensitivity of the sensor can be achieved in the needed frequency range. The inductor may be a relatively small inductive element and/or may be an already existing component of the arc fault detection device, e.g. a magnetic actuator used to trip the arc fault detection device in case of a short circuit.

According to an embodiment of the invention, the arc fault detection device further comprises a circuit breaker adapted for interrupting the electric line. The inductor may be a magnetic actuator adapted for operating the circuit breaker. The capacitance of the capacitor may be chosen such that the impedance behavior of the resonant circuit corresponds to the desired impedance behavior. In other words, given a certain inductance of the inductor, the capacitance of the capacitor may be chosen such that the resonant circuit has a desired resonance frequency that causes the resonant circuit to have the desired impedance behavior. The circuit breaker may be a switch, e.g. a contactor or relay, arranged in a conductor of the electric line. The conductor may be interrupted by switching the circuit breaker into an open state. The circuit breaker may also be a combination of two or more switches arranged in different conductors of the electric line. For example, the switches of different conductors may be mechanically coupled to each other. The magnetic actuator may be seen as an inductor with a given inductance. It may be that the magnetic actuator is adapted for operating a trip mechanism of the arc fault detection device. The trip mechanism may be adapted for mechanically coupling the magnetic actuator to the circuit breaker. The magnetic actuator may be adapted for operating the trip mechanism in such a way that the circuit breaker is switched into the open state. It is possible that the trip mechanism also comprises a handle for manually operating the circuit breaker. With this embodiment, an already existing component of the arc fault detection device, i.e. a magnetic actuator used to interrupt the electric line, can be used as the inductor of the sensor.

According to an embodiment of the invention, one end of the inductor is used as a reference point for at least one of the sensor and the controller. In other words, a terminal of at least one of the sensor and the controller may be connected to a reference point at a load side or a line side of the inductor. It may be that the (electronic) components of the sensor, the controller and/or the arc fault detection device are connected to the reference point. The reference point may be arranged in a line that connects the inductor to a load side terminal or a line side terminal of the arc fault detection device. With this embodiment, the use of differential amplifiers can be avoided, which further reduces the manufacturing costs of the arc fault detection device.

According to an embodiment of the invention, the sensor further comprises a resistor connected in parallel with the capacitor. With this embodiment, the impedance of the resonant circuit can be limited to a desired maximum.

According to an embodiment of the invention, the sensor further comprises a protection circuit adapted for limiting an output current and/or output voltage of the sensor. An input of the controller may be connected via the protection circuit to the resonant circuit. In other words, the protection circuit may be adapted for limiting a current and/or a voltage in subparts of the arc fault detection device, such as the controller, amplification circuits, etc. For example, measuring a voltage across the inductor can cause high transient voltages that can harm electronic components of the arc fault detection device. With this embodiment, the arc fault detection device, especially the controller and/or the sensor, can be protected against such transient voltages or currents, which ensures reliable operation of the arc fault detection device.

According to an embodiment of the invention, the protection circuit comprises a protection capacitor connected in series with the resistor. By including such a protection capacitor in the protection circuit, not only the controller, but also (the passive part of) the sensor can be protected by means of the protection circuit. With this embodiment, the resistor can be protected against slower high-power transients, e.g. at around 1 kHz.

According to an embodiment of the invention, the protection circuit comprises a transient blocking unit connected between the capacitor and the controller and adapted for blocking currents higher than a predefined current threshold. The transient blocking unit may be connected in series with the resonant circuit. For example, the transient blocking unit may be connected between the capacitor and a transient voltage suppressor, e.g. in the form of one or more pairs of antiparallel diodes (see below). With this embodiment, complexity and size of the protection circuit can be reduced.

According to an embodiment of the invention, the protection circuit comprises a transient voltage suppressor. The transient voltage suppressor (TVS) may, for example, comprise a transient voltage suppression diode or an arrangement of multiple transient voltage suppression diodes. Alternatively or additionally, the transient voltage suppressor may comprise one or more (metal-oxide) varistors (MOV). With this embodiment, high voltage peaks at the output of the sensor can be avoided.

Additionally or alternatively to the transient voltage suppressor and/or the transient blocking unit, the protection circuit may comprise at least one gas discharge tube (GDT) for protecting the controller and/or the sensor against overvoltage.

According to an embodiment of the invention, the transient voltage suppressor comprises at least one pair of antiparallel diodes connected in parallel with the capacitor. For example, the diodes may be Schottky or p-n junction diodes.

According to an embodiment of the invention, the transient voltage suppressor comprises at least two pairs of antiparallel diodes connected in parallel with the capacitor, the diodes of one of the two pairs being Schottky diodes. For example, the transient voltage suppressor may comprise a first pair of antiparallel Schottky diodes and a second pair of antiparallel p-n junction diodes, the first pair and the second pair connected in parallel with the capacitor. With this embodiment, the use of a transient blocking unit can be avoided, which further reduces the manufacturing costs of the arc fault detection device.

According to an embodiment of the invention, a protection resistor is connected between the capacitor and the at least one pair of antiparallel diodes. The protection resistor may be a component of the transient voltage suppressor.

According to an embodiment of the invention, a first protection resistor is connected between the capacitor and a first pair of antiparallel diodes, wherein a second protection resistor is connected between the first pair of antiparallel diodes and a second pair of antiparallel diodes.

According to an embodiment of the invention, the sensor further comprises a filter circuit adapted for providing at least one filtered signal from the sensor signal and the controller is adapted for detecting the arc fault from the at least one filtered signal. The filter circuit may comprise hardware and/or software components. For example, the filter circuit may comprise at least one of a bandpass filter, a low-pass filter and a high-pass filter. Accordingly, the filter circuit may have one or more signal outputs, e.g. a low-frequency output for outputting a low-frequency sensor signal and a high-frequency output for outputting a high-frequency sensor signal. With this embodiment, the controller can be supplied with a sensor signal in one or more specific frequency bands of interest.

According to an embodiment of the invention, the filter circuit is connected via the protection circuit to the resonant circuit. With this embodiment, the filter circuit can be protected against high currents and/or voltages.

A second aspect of the invention relates to a method for operating an arc fault detection device according to an embodiment of the first aspect of the invention. The method may be automatically performed by the controller of the arc fault detection device. The method comprises: receiving the sensor signal from the sensor; determining from the sensor signal whether the electric line has an arc fault or not; when the arc fault is detected: generating a trip signal for interrupting the electric line.

According to an embodiment of the invention, at least one of a low-frequency component and a high-frequency component is extracted from the sensor signal and is analyzed to determine whether the electric line has an arc fault or not. For example, the high-frequency component may comprise frequencies in a Megahertz range, e.g. 1 MHz or greater, whereas the low-frequency component may comprise frequencies significantly lower than 1 MHz.

A third aspect of the invention relates to a computer program comprising instructions which, when the computer program is executed by a computer, e.g. the controller of the arc fault detection device, cause the computer to carry out the method according to an embodiment of the second aspect of the invention.

For example, the computer program may be stored in a memory of the controller and may be executed by a processor of the controller.

A fourth aspect of the invention relates to a computer-readable medium comprising instructions which, when executed by a computer, cause the computer to carry out the method according to an embodiment of the second aspect of the invention.

A computer-readable medium may be a floppy disk, a hard disk, a USB (Universal Serial Bus) storage device, a RAM (Random Access Memory), a ROM (Read Only Memory), an EPROM (Erasable Programmable Read Only Memory) or a FLASH memory. A computer-readable medium may also be a data communication network, e.g. the Internet, which allows downloading a program code. In general, the computer-readable medium may be a non-volatile or volatile memory.

It has to be understood that features of the arc fault detection device as described above and below may be features of the method, the computer program and the computer-readable medium as described above and below, and vice versa.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
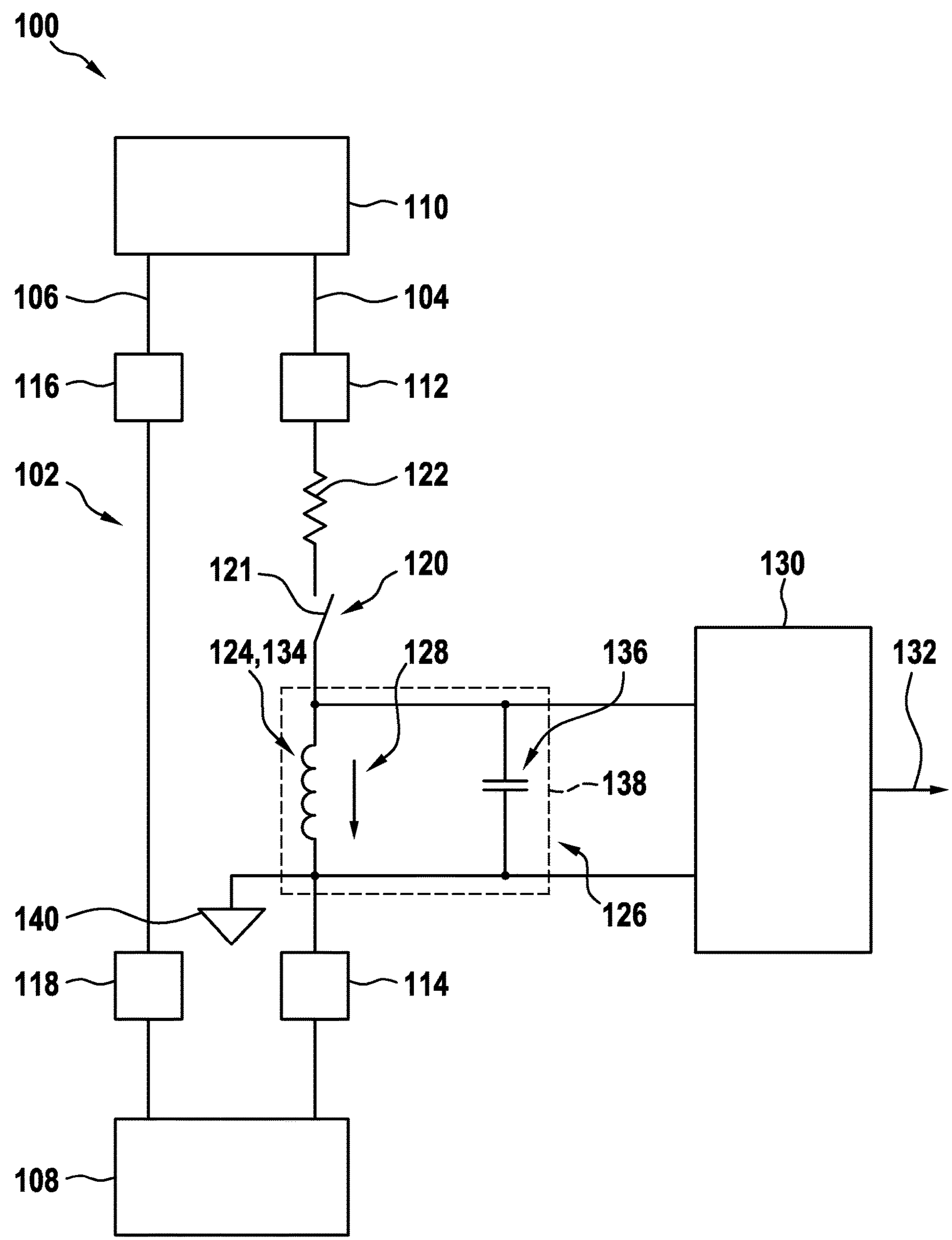
FIG. 1 schematically shows an arc fault detection device according to an embodiment of the invention.

FIG. 1 schematically shows an arc fault detection device 100 adapted for detecting an arc fault in an electric line 102, such as a series or parallel arc or an arc to ground. The electric line 102 may comprise one or more conductors, e.g. a phase conductor 104 and a neutral conductor 106, which connect a load 108 to an electric power source 110, e.g. a power grid or a battery. In this example, the arc fault detection device 100 is electrically connected to the phase conductor 104 via a first phase terminal 112 and a second phase terminal 114 and to the neutral conductor 106 via a first neutral terminal 116 and a second neutral terminal 118.

Generally, the arc fault detection device 100 may be adapted for interrupting the electric line 102, i.e. for disconnecting the load 108 from the electric power source 110, when an arc fault is detected in at least one of the conductors 104, 106 and/or between the two conductors 104, 106 and/or between one of the two conductors 104, 106 and ground. In this example, the arc fault detection device 100 comprises a circuit breaker 120 with a circuit breaker switch 121 arranged in the phase conductor 104. Additionally, the arc fault detection device 100 may comprise a bimetal 122 for protecting the electric line 102 against an overload and a magnetic actuator 124 for protecting the electric line 102 against short circuits. The bimetal 122 and the magnetic actuator 124 may be connected in series with the circuit breaker switch 121.

Furthermore, the arc fault detection device 100 comprises a sensor 126 for detecting a current through the electric line 102, here through the phase conductor 104. The sensor 126 is adapted for providing a sensor signal 128, e.g. a voltage signal, in dependence of the detected current.

A controller 130 of the arc fault detection device 100 receives the sensor signal 128 from the sensor 126 and analyzes it using a specific detection algorithm to detect an arc fault. The controller 130 may comprise at least a processor and a memory (not shown) to perform such an algorithm. The algorithm may be implemented as hardware and/or software. The controller 130 may be adapted for analyzing the sensor signal 128 in one or more specific frequency bands. The controller 130 may further be adapted for generating a trip signal 132 when an arc fault is detected.

It may be that an auxiliary switch (not shown), e.g. an electronic switch, is operated by means of the trip signal 132, which, when operated, causes the circuit breaker switch 121 to interrupt the phase conductor 104.

For example, at least one of the magnetic actuator 124, the bimetal 122 and the auxiliary switch may be coupled to the circuit breaker switch 121 via a trip mechanism (not shown) of the arc fault detection device 100. The trip mechanism may also be operable manually by a user.

In order to convert the current through the electric line 102 to the sensor signal 128, the sensor 126 comprises an inductor 134, which is connected to the terminals of one of the conductors 104, 106. In this example, the inductor 134 is connected at a line side to the first phase terminal 112 (via the circuit breaker switch 121 and the bimetal 122) and at a load side to the second phase terminal 114. Alternatively, the inductor 134 may be connected to the second phase terminal 114 via the circuit breaker switch 121 and the bimetal 122.

For example, the inductor 134 may be the magnetic actuator 124. Alternatively, the inductor 134 may be realized as a separate inductive element arranged in the electric line 102.

The sensor 126 further comprises a capacitor 136 connected in parallel with the inductor 134. The inductor 134 and the capacitor 136 form a resonant circuit 138 with a resonance frequency that is adapted to a desired impedance behavior of the resonant circuit 138 over a frequency range of interest. In other words, the resonance frequency is adjusted such that the resonant circuit 138 has a certain impedance behavior over the frequency range of interest (see also FIG. 4 and FIG. 5). For a given inductor, here in the form of the magnetic actuator 124, the resonance frequency may be adjusted based on a capacitance of the capacitor 136 and/or a resistance of a parallel-connected resistor (not shown in FIG. 1). For example, the resonance frequency may be adjusted to around 10 MHz or more. A sensor signal input of the controller 130 may be connected to the inductor 134 via the capacitor 136.

With the resonant circuit 138, the impedance behavior of the sensor 126 can be precisely adapted to the signal strength at the frequencies of interest. In that way, a very high sensitivity of the sensor 126 can be achieved. For example, the cost and size constraint can be met by choosing a relatively small inductive element and then adapting its impedance accordingly. As mentioned above, an additional inductive element is not necessarily required to implement the sensor 126. Instead, an existing component inside the arc fault detection device 100, such as the magnetic actuator 124 or any other suitable inductive component, can be used as the inductor 134. The magnetic actuator 124 behaves like an inductor and may be used to trip the arc fault detection device 100 in case of a short circuit. By adjusting its impedance in a suitable manner, the magnetic actuator 124 may, for example, be used to sense an arc fault current in a frequency range from 50 Hz to 20 MHz.

It may be that all electric and/or electronic components of the sensor 126 and/or the controller 130 are connected to a common reference point 140, which may be arranged at a load side of the inductor 134, as shown in FIG. 1, or, alternatively, at a line side of the inductor 134, i.e., the reference point 140 may be at either of two ends of the inductor 134. The reference point 140 may be connected to ground.

Additionally to the resonant circuit 138, which acts as an impedance matching stage of the sensor 126, the sensor 126 may comprise at least one of a protection stage for protecting the controller 130 against an overcurrent and/or overvoltage and a filter stage for filtering the sensor signal 128, as described in more detail below.

Figure 2:
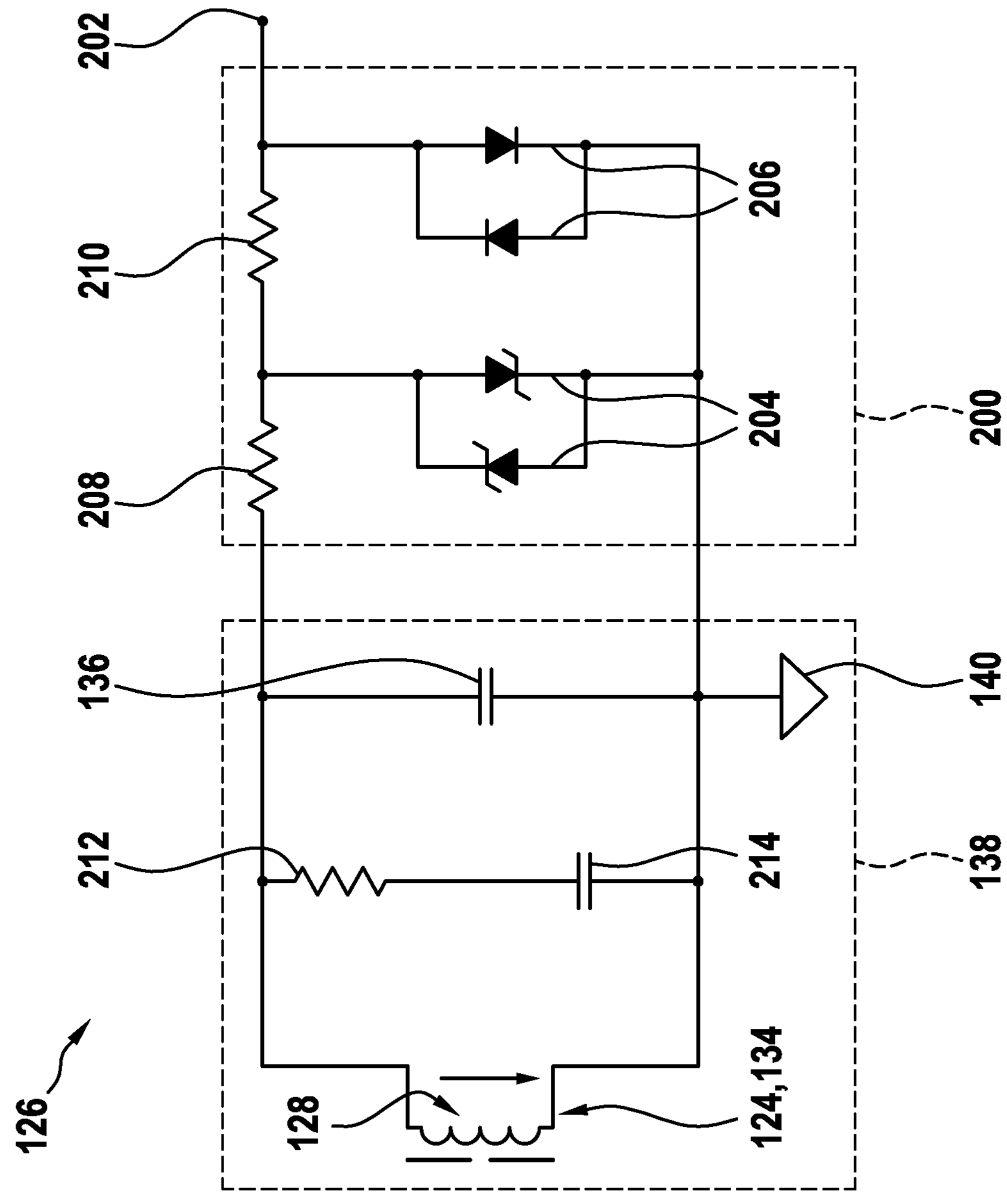
FIG. 2 schematically shows a sensor of an arc fault detection device according to an embodiment of the invention.

FIG. 2 schematically shows the sensor 126 with the resonant circuit 138 and an optional protection circuit 200 for limiting a current through and/or a voltage across the sensor 126 and the controller 130. The protection circuit 200 interconnects the resonant circuit 138 with a sensor signal output 202 of the sensor 126, which may be connected to the sensor signal input of the controller 130 as shown in FIG. 1.

In this example, the protection circuit 200 comprises a first pair of antiparallel Schottky diodes 204 and a second pair of antiparallel p-n junction diodes 206. Both pairs are connected in parallel with the inductor 134 and the capacitor 136. The antiparallel p-n junction diodes 206 may be arranged between the Schottky diodes 204 and the sensor signal output 202.

It may be that the protection circuit 200 further comprises a first protection resistor 208 arranged between the capacitor 136 and the first pair and a second protection resistor 210 arranged between the first pair and the second pair. The protection resistors 208, 210 may have equal or different resistances.

As already mentioned above with respect to FIG. 1, the resonant circuit 138 may comprise a resistor 212 connected in parallel with the inductor 134 and the capacitor 136. The resistor 212, depending on its resistance, limits the impedance of the resonant circuit 138 to a desired maximum.

To protect the resistor 212 against an overcurrent and/or overvoltage, the protection circuit 200 may further comprise a protection capacitor 214, or blocking capacitor 214, connected in series with the resistor 212.

The components of the resonant circuit 138 and the protection circuit 200 may each be connected to the reference point 140, e.g. at the load side of the inductor 134, i.e. of the magnetic actuator 124.

Figure 3:
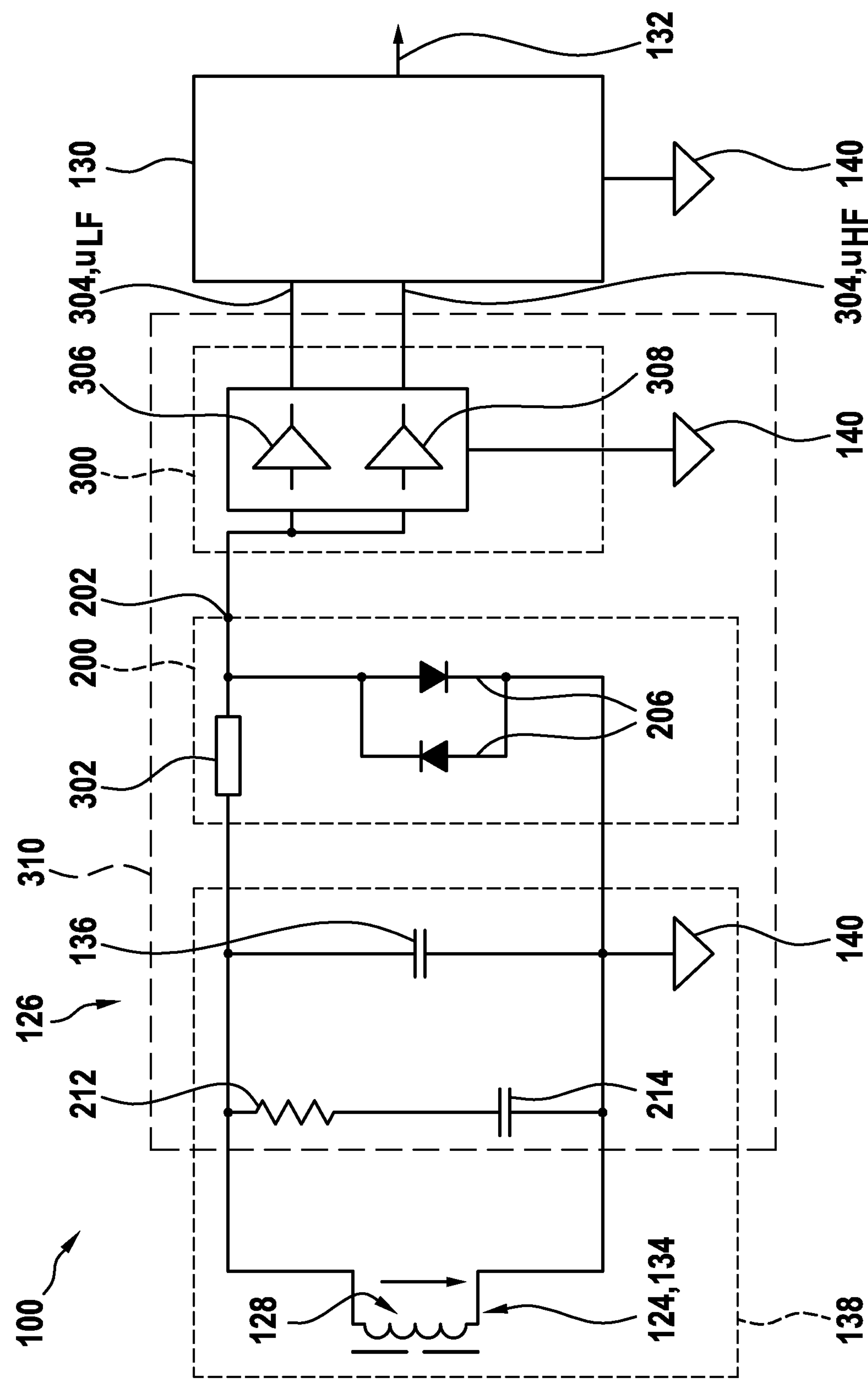
FIG. 3 schematically shows an arc fault detection device according to a further embodiment of the invention.

As mentioned above, the sensor 126 may further comprise a filtering stage in the form of a filter circuit, as shown in FIG. 3.

FIG. 3 shows the resonant circuit 138 of FIG. 2 in combination with the protection circuit 200 and a filter circuit 300. The filter circuit 300 may be arranged between the protection circuit 200 and the sensor signal output 202 of the sensor 126. In contrast to FIG. 2, the protection circuit 200 here comprises only one pair of antiparallel diodes 206, which are connected in parallel with the inductor 134 and the capacitor 136. The diodes 206 may be p-n junction diodes.

A transient blocking unit (TBU) 302 adapted for blocking currents higher than a specific current threshold may be arranged between the capacitor 136 and the antiparallel diodes 206. The transient blocking unit 302 may be seen as a non-linear active resistor. By using the transient blocking unit 302 (instead of two pairs of diodes), a more compact version of the arc fault detection device 100 can be realized.

The filter circuit 300 generates at least one filtered signal 304 from the sensor signal 128.

For example, the filter circuit 300 may comprise a low-pass filter 306 adapted for outputting a low-frequency voltage $u_{LF}$ and a high-pass filter 308, e.g. a Sallen-Key high-pass filter with $f_0$=100 kHz, adapted for outputting a high-frequency voltage $u_{HF}$. Alternatively, the filter circuit 300 may be a bandpass filter.

Accordingly, the controller 130 may be adapted for generating the trip signal 132 from the filtered signals 304, $u_{LF}$, $u_{HF}$ by analyzing the filtered signals 304, $u_{LF}$, $u_{HF}$ with an arc fault detection algorithm (see above).

The requirements for the inductor 134 may be a high inductance and a high self-resonance frequency. The self-resonance frequency should be above a maximum frequency of interest. In general, it is required that the inductor 134 converts the current through the electric line 102 into a sensor signal 128 above the voltage noise of the amplifiers of the arc fault detection device 100 at all frequencies of interest. The matching stage may increase or decrease the impedance according to the signal level of an arc fault signal. The matching stage may be built using capacitors and resistors. Finally, the protection stage ensures that peak voltages, which may appear on an inductor, cannot propagate through the electronics of the arc fault detection device 100.

An inductor is well-suited for sensing arc fault signals over a wide frequency range, because its impedance increases with the frequency of the arc fault signal, whereas the power spectral density of the arc fault signal decreases with its frequency. Ideally, the impedance should increase proportional to $\sqrt{f}$ to match the decrease in signal power of 1/f, i.e. the decrease of the signal amplitude proportional to $1/\sqrt{f}$. To compensate for that mismatch, amplifiers already present in the arc fault detection device 100 may be used.

As indicated in FIG. 3 with a dotted line, the sensor 126 may, at least partially, be implemented on a power supplied main board 310 of the arc fault detection device 100. The controller 130 may also be a component of the main board 310 or may be implemented on a separate controller board (not shown).

Figure 4:
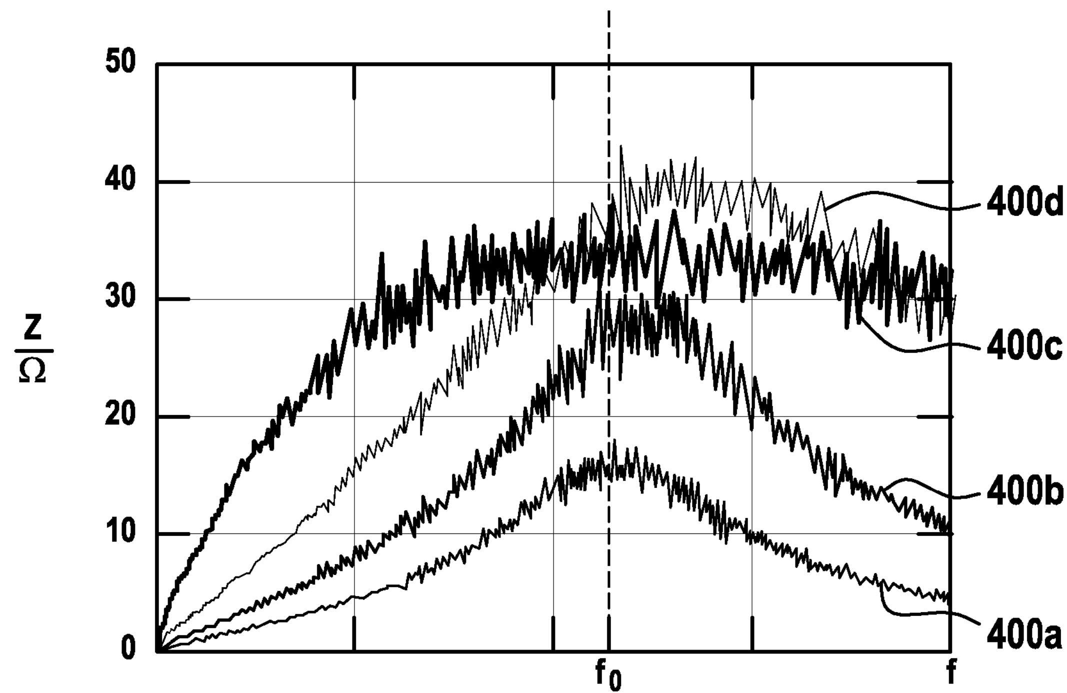
FIG. 4 shows a diagram illustrating a transfer impedance behavior of a resonant circuit of an arc fault detection device according to an embodiment of the invention.
Figure 5:
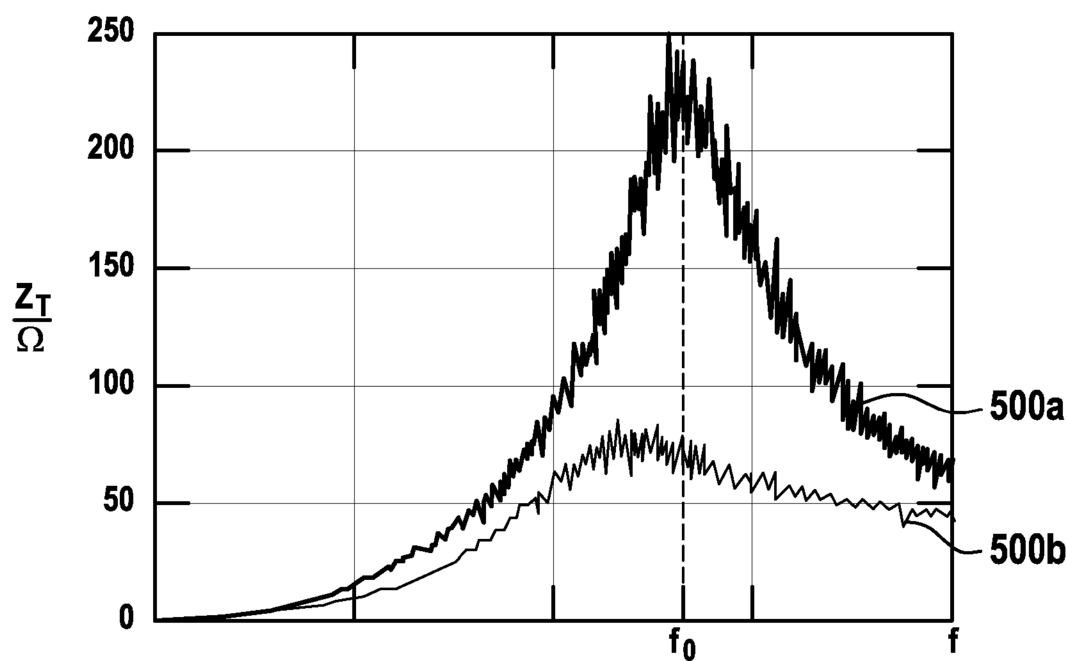
FIG. 5 shows a diagram illustrating a transfer impedance behavior of a sensor of an arc fault detection device according to an embodiment of the invention.

FIG. 4 and FIG. 5 show examples for desired impedance behaviors over a relevant frequency range of the current through the electric line 102, which, for example, may comprise frequencies up to at least 10 MHz.

FIG. 4 shows the transfer impedance Z of the resonant circuit 138 for four different configurations of the arc fault detection device 100 in dependence of a frequency f. Each configuration is represented by a different impedance curve 400*a* to 400*d*, which indicate a magnitude of the transfer impedance Z. The maximum of each impedance curve 400*a* to 400*d* corresponds to the resonance frequency $f_0$ of the respective resonant circuit 138 and is limited by the resistor 212 of the respective resonant circuit 138.

In other words, the capacitor 136 may resonate with the inductor 134 at the resonance frequency $f_0$, while the resistor 212 limits the peak impedance at resonance. If not limited, the impedance could become so large that it blocks the current at the resonance frequency $f_0$. Depending on a given quality factor and a given inductance of the inductor 134, the impedance at resonance may vary. In general, the impedance may be seen as a measure for the sensitivity of the sensor 126 at a given frequency.

Frequencies as low as 50 Hz are very important in view of arc fault detection because they contain information about arc faults as well as about other loads connected to the installations. In this low-frequency band, it is the ohmic resistance of the windings in the inductor 134 that mostly contributes to the impedance.

FIG. 5 exemplarily shows a desired behavior of a transfer impedance $Z_T$ of the sensor 126, represented by a first transfer impedance curve 500*a* in comparison to the transfer impedance $Z_T$ of a conventional arc fault detection sensor with two current transformers, represented by a second transfer impedance curve 500*b*. Both curves 500*a*, 500*b* indicate a magnitude of the transfer impedance $Z_T$. The transfer impedance $Z_T$ is indicative of the ability of a current sensor to convert a sensed current into voltage and may be measured in the sensor 126 between the output of the filter circuit 300 and the current injected into the magnetic actuator 124.

As can be seen from FIG. 5, the transfer impedance $Z_T$ of the sensor 126 around the resonance frequency $f_0$ is at least four times higher than the transfer impedance $Z_T$ of the conventional sensor and rapidly decreases around the resonance peak, which makes the sensor 126 more selective in the desired frequency band.

Figure 6:
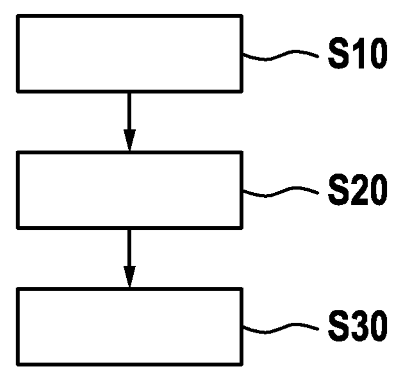
FIG. 6 shows a flow diagram illustrating a method for operating an arc fault detection device according to an embodiment of the invention.

FIG. 6 shows a flow diagram for a method for operating the arc fault detection device 100 of FIGS. 1 to 3.

In step S10, the sensor signal 128, or the one or more filtered signals 304, $u_{LF}$, $u_{HF}$, is received at the sensor signal input of the controller 130 from the sensor signal output 202 of the sensor 126.

In step S20, the controller 130 determines from the sensor signal 128, or from the one or more filtered signals 304, $u_{LF}$, $u_{HF}$, whether the electric line 102 has an arc fault or not, e.g. whether there is a series arc in at least one of the conductors 104, 106, a parallel arc between the two conductors 104, 106 or an arc between one of the two conductors 104, 106 and ground. The detection of the arc fault may be performed by analyzing the respective signal in different frequency bands using a specific algorithm (see above).

In step S30, when the arc fault is detected, the trip signal 132 is output by the controller 130, which causes the circuit breaker switch 121 to interrupt the phase conductor 104.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. A single processor or superordinate controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS

100 arc fault detection device
102 electric line
104 phase conductor
106 neutral conductor
108 load
110 electric power source
112 first terminal, first phase terminal
114 second terminal, second phase terminal
116 first neutral terminal
118 second neutral terminal
120 circuit breaker
121 circuit breaker switch
122 bimetal
124 magnetic actuator
126 sensor
128 sensor signal
130 controller
132 trip signal
134 inductor
136 capacitor
138 resonant circuit
140 reference point
200 protection circuit
202 sensor signal output
204 Schottky diode, transient voltage suppressor
206 p-n junction diode, transient voltage suppressor
208 first protection resistor
210 second protection resistor
212 resistor
214 protection capacitor
300 filter circuit
302 transient blocking unit
304 filtered signal
306 low-pass filter
308 high-pass filter
310 main board
400*a-d* impedance curves
500*a* first transfer impedance curve
500*b* second transfer impedance curve
$f_0$ resonance frequency
$u_{LF}$ low-frequency voltage
$u_{HF}$ high-frequency voltage

The invention claimed is:

1. An arc fault detection device for detecting an arc fault in an electric line, the arc fault detection device comprising:
- a first terminal and a second terminal configured to connect the arc fault detection device to a conductor of the electric line;
- a sensor configured to generate a sensor signal from a current through the electric line;
- a circuit breaker configured to interrupt the electric line; and
- a controller configured to detect the arc fault from the sensor signal;
- wherein the sensor comprises an inductor connected to the first terminal and the second terminal and a capacitor connected in parallel with the inductor,
- wherein the inductor and the capacitor form a resonant circuit with a resonance frequency, the resonance frequency determining an impedance behavior of the resonant circuit,
- wherein the inductor and a capacitance of the capacitor are chosen such that the impedance behavior of the resonant circuit corresponds to a desired impedance behavior over a relevant frequency range of the current through the electric line, and
- wherein the inductor is a magnetic actuator configured to operate the circuit breaker.

2. The arc fault detection device of claim 1,
wherein one end of the inductor is used as a reference point for at least one of the sensor and the controller.

3. The arc fault detection device of claim 1,
wherein the sensor further comprises a resistor connected in parallel with the capacitor.

4. The arc fault detection device of claim 1,
wherein the sensor further comprises a protection circuit configured to limit an output current and/or output voltage of the sensor;
wherein an input of the controller is connected via the protection circuit to the resonant circuit.

5. The arc fault detection device of claim 4,
wherein the sensor further comprises a resistor connected in parallel with the capacitor, and
wherein the protection circuit comprises a protection capacitor connected in series with the resistor.

6. The arc fault detection device of claim 4,
wherein the protection circuit comprises a transient blocking unit connected between the capacitor and the controller and adapted for blocking currents higher than a predefined current threshold; and/or
wherein the protection circuit comprises a transient voltage suppressor.

7. The arc fault detection device of claim 6,
wherein the transient voltage suppressor comprises at least one pair of antiparallel diodes connected in parallel with the capacitor; and/or
wherein the transient voltage suppressor comprises at least two pairs of antiparallel diodes connected in parallel with the capacitor, the diodes of one of the two pairs being Schottky diodes.

8. The arc fault detection device of claim 7,
wherein a protection resistor is connected between the capacitor and the at least one pair of antiparallel diodes; and/or
wherein a first protection resistor is connected between the capacitor and a first pair of antiparallel diodes and a second protection resistor is connected between the first pair of antiparallel diodes and a second pair of antiparallel diodes.

9. The arc fault detection device of claim 1,
wherein the sensor further comprises a filter circuit adapted for providing at least one filtered signal from the sensor signal;
wherein the controller is adapted for detecting the arc fault from the at least one filtered signal.

10. The arc fault detection device of claim 9,
wherein the sensor further comprises a protection circuit configured to limit an output current and/or output voltage of the sensor;
wherein an input of the controller is connected via the protection circuit to the resonant circuit; and
wherein the filter circuit is connected via the protection circuit to the resonant circuit.

11. A method for operating an arc fault detection device including a first terminal and a second terminal configured to connect the arc fault detection device to a conductor of an electric line;

a sensor configured to generate a sensor signal from a current through the electric line;

a circuit breaker configured to interrupt the electric line; and a controller configured to detect the arc fault from the sensor signal;

wherein the sensor comprises an inductor connected to the first terminal and the second terminal and a capacitor connected in parallel with the inductor, wherein the inductor and the capacitor form a resonant circuit with a resonance frequency, the resonance frequency determining an impedance behavior of the resonant circuit, wherein the inductor and a capacitance of the capacitor are chosen such that the impedance behavior of the resonant circuit corresponds to a desired impedance behavior over a relevant frequency range of the current through the electric line, and wherein the inductor is a magnetic actuator configured to operate the circuit breaker, the method comprising:

receiving the sensor signal from the sensor;

determining from the sensor signal whether the electric line has an arc fault or not;

when the arc fault is detected: generating a trip signal for interrupting the electric line.

12. The method of claim 11, wherein at least one of a low-frequency component and a high-frequency component is extracted from the sensor signal and is analyzed to determine whether the electric line has an arc fault or not.

13. A computer program comprising instructions which, when the computer program is executed by a computer, cause the computer to carry out the method of claim 11.

14. A computer-readable medium comprising instructions which, when executed by a computer, cause the computer to carry out the method of claim 11.

15. An arc fault detection device for detecting an arc fault in an electric line, the arc fault detection device comprising:

a first terminal and a second terminal configured to connect the arc fault detection device to a conductor of the electric line;

a sensor configured to generate a sensor signal from a current through the electric line; and a controller configured to detect the arc fault from the sensor signal, wherein the sensor comprises an inductor connected to the first terminal and the second terminal and a capacitor connected in parallel with the inductor, wherein the inductor and the capacitor form a resonant circuit with a resonance frequency, the resonance frequency determining an impedance behavior of the resonant circuit, wherein the inductor and the capacitor are chosen such that the impedance behavior of the resonant circuit corresponds to a desired impedance behavior over a relevant frequency range of the current through the electric line, wherein the sensor further comprises a protection circuit configured to limit an output current and/or output voltage of the sensor, and wherein an input of the controller is connected via the protection circuit to the resonant circuit.

16. The arc fault detection device of claim 15, wherein the sensor further comprises a resistor connected in parallel with the capacitor, and wherein the protection circuit comprises a protection capacitor connected in series with the resistor.

17. The arc fault detection device of claim 15, wherein the protection circuit comprises a transient blocking unit connected between the capacitor and the controller and adapted for blocking currents higher than a predefined current threshold; and/or wherein the protection circuit comprises a transient voltage suppressor.

18. The arc fault detection device of claim 17, wherein the transient voltage suppressor comprises at least one pair of antiparallel diodes connected in parallel with the capacitor; and/or wherein the transient voltage suppressor comprises at least two pairs of antiparallel diodes connected in parallel with the capacitor, the diodes of one of the two pairs being Schottky diodes.

19. The arc fault detection device of claim 18, wherein a protection resistor is connected between the capacitor and the at least one pair of antiparallel diodes; and/or wherein a first protection resistor is connected between the capacitor and a first pair of antiparallel diodes and a second protection resistor is connected between the first pair of antiparallel diodes and a second pair of antiparallel diodes.

* * * * *